(12) United States Patent
Weber et al.

(10) Patent No.: US 9,099,354 B2
(45) Date of Patent: Aug. 4, 2015

(54) TRANSISTORS WITH VARIOUS LEVELS OF THRESHOLD VOLTAGES AND ABSENCE OF DISTORTIONS BETWEEN NMOS AND PMOS

(71) Applicants: Commissariat a l'energie atomique et aux energies alternatives, Paris (FR); STMicroelectronics (Crolles 2) SAS, Crolles (FR)

(72) Inventors: Olivier Weber, Grenoble (FR); Nicolas Planes, La Terrasse (FR); Rossella Ranica, Saint Martin d'Hères (FR)

(73) Assignees: Commissariat à l'énergie atomique et aux énergies alternatives, Paris (FR); STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 14/309,385

(22) Filed: Jun. 19, 2014

(65) Prior Publication Data
US 2015/0041900 A1    Feb. 12, 2015

(30) Foreign Application Priority Data
Jun. 19, 2013   (FR) ..................................... 13 55796

(51) Int. Cl.
*H01L 27/12*    (2006.01)
*H01L 27/092*   (2006.01)

(52) U.S. Cl.
CPC ........ *H01L 27/1203* (2013.01); *H01L 27/0922* (2013.01)

(58) Field of Classification Search
CPC .............. H01L 27/092; H01L 21/7624; H01L 21/76264; H01L 27/0928
USPC ......... 257/347, 348, 349, 350, 351, 369, 371, 257/407, 618, E27.061, E27.062, E27.067
See application file for complete search history.

(56) References Cited

U.S. PATENT DOCUMENTS

| 6,063,686 A | * | 5/2000 | Masuda et al. ................ 438/406 |
| 2007/0063284 A1 | * | 3/2007 | Kawahara et al. ............ 257/351 |

(Continued)

FOREIGN PATENT DOCUMENTS

WO    2012161859    11/2012

OTHER PUBLICATIONS

Noel et al., "Multi-$V_t$ UTBB FDSOI Device Architectures for Low-Power CMOS Circuit," IEEE Transactions on Electron Devices, vol. 58, No. 8 (2011).
Skotnicki, "Competitive SOC with UTBB SOI," SOI Conference (SOI), IEEE International (2011).

(Continued)

*Primary Examiner* — Eduardo A Rodela
(74) *Attorney, Agent, or Firm* — Occhiuti & Rohlicek LLP

(57) ABSTRACT

The invention relates to an integrated circuit comprising a semi-conducting substrate and first and second cells. Each cell comprises first and second transistors of nMOS and pMOS type including first and second gate stacks including a gate metal. There are first and second ground planes under the first and second transistors and an oxide layer extending between the transistors and the ground planes. The gate metals of the nMOS and of a pMOS exhibit a first work function and the gate metal of the other pMOS exhibiting a second work function greater than the first work function. The difference between the work functions is between 55 and 85 meV and the first work function Wf1 satisfies the relation $Wfmg - 0.04 - 0.005 \cdot Xge < Wf1 < Wfmg - 0.03 - 0.005 \cdot Xge$.

6 Claims, 2 Drawing Sheets

(56) References Cited

U.S. PATENT DOCUMENTS

| | | | |
|---|---|---|---|
| 2012/0126333 A1* | 5/2012 | Thomas et al. | 257/369 |
| 2013/0020638 A1* | 1/2013 | Thompson et al. | 257/338 |
| 2013/0065366 A1 | 3/2013 | Thomas et al. | |
| 2014/0077300 A1* | 3/2014 | Noel et al. | 257/351 |

OTHER PUBLICATIONS

Weber et al., "Work-function Engineering in Gate First Technology for Multi-$V_t$ Dual Gate FDSOI CMOS on UTBOX," Electron Devices Meeting (IEDM), IEEE International (2010).

\* cited by examiner

TRANSISTORS WITH VARIOUS LEVELS OF THRESHOLD VOLTAGES AND ABSENCE OF DISTORTIONS BETWEEN NMOS AND PMOS

RELATED APPLICATIONS

Under 35 USC 119, this application claims the benefit of the Jun. 19, 2013 priority date of French application FR 1355796, the contents of which are herein incorporated by reference.

FIELD OF INVENTION

The invention relates to an integrated circuit, and in particular an integrated circuit produced on a substrate of Silicon-On-Insulator (SOI) type and comprising rows of nMOS transistors and of pMOS transistors.

BACKGROUND

SOI technology consists of separating a fine silicon layer (a few nanometres) on a silicon substrate by a relatively thick insulator layer (a few tens of nanometres as a general rule).

Integrated circuits produced in SOI technology exhibit a certain number of advantages. Such circuits generally exhibit lower electrical consumption for equivalent performance. Such circuits also induce lower parasitic capacitances, which make it possible to improve switching speed. Moreover, the phenomenon of parasitic triggering (known as "latchup") encountered by metal-oxide-semiconductor (MOS) transistors in "bulk" technology can be avoided. Such circuits therefore turn out to be particularly suitable for applications of SoC ("Systems on Chip") or MEMS ("Micro Electro-Mechanical Systems") type. It is also noted that SOI integrated circuits are less sensitive to the effects of ionizing radiations and thus turn out to be more reliable in applications where such radiations may induce operating problems, in particular in space applications. SOI integrated circuits may in particular comprise random-access memories of SRAM ("Static Random Access Memory") type or logic gates.

The reduction in the static consumption of logic gates while increasing their tripping speed forms the subject of much research. Certain integrated circuits in the course of development integrate logic gates with low consumption and also logic gates with high tripping speed. To generate these two types of logic gates on one and the same integrated circuit, the threshold voltage (abbreviated $V_T$) of certain transistors is lowered to form logic gates with high tripping speed, and the threshold voltage of other transistors is increased to form logic gates with low consumption. In "bulk" technology, the modulation of the threshold voltage level of transistors of the same type is performed by differentiating their channel doping level. However, in fully depleted channel semi-conductor on insulator technology, better known by the acronym FDSOI (for "Fully Depleted Silicon On Insulator"), the doping of the channel is almost zero ($10^{15}$ cm$^{-3}$). Thus, the doping level of the channel of the transistors cannot therefore exhibit any significant variations, thereby preventing differentiation of the threshold voltages in this fashion.

In order to have distinct threshold voltages for various transistors in FDSOI technology, it is known to use an electrically biased ground plane (or "back-plane") disposed between a thin isolating oxide layer and the silicon substrate. By altering the doping of the ground planes and their electrical bias, it is possible to improve the electrostatic control of these transistors, thereby making it possible to define various ranges of threshold voltages for these transistors. It is thus possible to have low-threshold-voltage transistors termed LVT (for "Low VT", typically 400 mV), high-threshold-voltage transistors termed HVT (for "High VT", typically 550 mV) and intermediate-threshold-voltage transistors termed RVT (for "Regular VT", typically 450 mV).

In a known manner, such transistors exhibiting different threshold voltages can be integrated within one and the same integrated circuit. Such co-integration makes it possible in particular to benefit from several threshold voltage spans, together with better operating flexibility of the circuit.

FIGS. 1 and 2 illustrate an example of integrated circuit of a known type in 28 nm technology. FIGS. 1 and 2 are schematic sectional views of an integrated circuit at the level of nMos/pMos pairs respectively of RVT type and of LVT type. The integrated circuit comprises a bias circuit, for applying electrical biases Vdd and Gnd.

FIG. 1 represents a first cell of RVT type of the integrated circuit. The first cell comprises a semi-conducting substrate 44. This substrate 44 here exhibits a doping of type p, with a concentration of dopants of less than or equal to $10^{16}$ cm$^{-3}$.

The first cell comprises:
a buried layer 43 of an electrically insulating material;
field-effect MOS transistors, namely an nMOS transistor ns and a pMOS transistor ps. The source, the drain and the channel of the transistor ns are formed in a semiconducting layer 11s disposed on the buried layer 43. The source, the drain and the channel of the transistor ps are formed in a semi-conducting layer 21s disposed on the buried layer 43; semi-conducting ground planes 41s and 42s are situated under the layer 43 and placed plumb, respectively, with the transistors ns and ps. The ground planes 41s and 42s respectively exhibit dopings of type p and n;
semi-conducting wells extend depth-wise in continuity respectively with the ground planes 41s and 42s. The wells form a separation between the ground planes 41s and 42s and the substrate 44.

The ground plane 41s and the well disposed in continuity therewith are biased to Gnd by way of a P+ implanted zone 32s. The ground plane 42s and the well disposed in continuity therewith are biased to Vdd by way of an N+ implanted zone 33s. One and the same bias is applied to the gates of the transistors ns and ps.

The first cell is isolated at its periphery by isolation trenches 61 and 66. The implanted zones 31s and 32s are separated by an isolation trench 62. The implanted zone 32s is separated from the transistor ns by way of an isolation trench 63. The transistor ns is separated from the transistor ps by an isolation trench 64. The transistor ps is separated from the implanted zone 33s by way of an isolation trench 65.

FIG. 2 represents a second cell of LVT type of the integrated circuit. The second cell comprises:
a buried layer 43 of an electrically insulating material;
field-effect MOS transistors, namely an nMOS transistor nl and a pMOS transistor pl. The source, the drain and the channel of the transistor nl are formed in a semi-conducting layer 11l disposed on the buried layer 43. The source, the drain and the channel of the transistor pl are formed in a semi-conducting layer 21l disposed on the buried layer 43;
semi-conducting ground planes 41l and 42l are situated under the layer 43 and placed plumb, respectively, with the transistors nl and pl. The ground planes 41l and 42l respectively exhibit dopings of type n and p;
semi-conducting wells extend depth-wise in continuity respectively with the ground planes 41l and 42l. The wells form a separation between the ground planes 41l and 42l and the substrate 44.

The ground plane 41*l* and the well disposed in continuity therewith are biased to Gnd by way of an N+ implanted zone 32*l*. The ground plane 42*l* and the well disposed in continuity therewith are biased to Gnd by way of a P+ implanted zone 33*l*. One and the same bias is applied to the gates of the transistors nl and pl.

The second cell is isolated at its periphery by isolation trenches 61 and 66. The implanted zones 31*l* and 32*l* are separated by an isolation trench 62. The implanted zone 32*l* is separated from the transistor nl by way of an isolation trench 63. The transistor nl is separated from the transistor pl by an isolation trench 64. The transistor pl is separated from the implanted zone 33*l* by way of an isolation trench 65.

The transistors ns, ps, nl and pl are produced according to FDSOI technology. The transistor ns comprises a semi-conducting layer 11*s*, surmounted by a gate stack 12*s*. This layer 11*s* forms a channel 13*s* between a source and a drain of the transistor ns. The transistor nl comprises a semi-conducting layer 11*l*, surmounted by a gate stack 12*l*. This layer 11*l* forms a channel 13*l* between a source and a drain of the transistor nl. The transistor ps comprises a semi-conducting layer 21*s*, surmounted by a gate stack 22*s*. This layer 21*s* forms a channel 23*s* between a source and a drain of the transistor ps. The transistor pl comprises a semi-conducting layer 21*l*, surmounted by a gate stack 22*l*. This layer 21*l* forms a channel 23*l* between a source and a drain of the transistor pl. In a manner known in FDSOI technology, the channels 13*s*, 13*l*, 23*s* and 23*l* are in a depleted state and exhibit a very low doping level, of less than or equal to $10^{15}$ cm$^{-3}$. The layer 43 exhibits a thickness of 25 nm, the layers 11*s*, 11*l*, 21*s* and 2*l* exhibit a thickness of 7 nm and the electrical thickness of the gate oxide in the gate stacks 12*s*, 12*l*, 22*s* and 22*l* is 1.5 nm. The gate stacks 12*s* and 12*l* comprise one and the same gate metal whose work function is 4.565 eV (middle of the forbidden band of the silicon, termed the midgap, of 4.6 eV−35 meV).

The gate stacks 22*s* and 22*l* comprise one and the same gate metal whose work function is 4.635 eV (midgap of 4.6 eV+35 meV).

The diagram of FIG. 3 illustrates the leakage currents and the conduction currents for the transistors ns, ps, nl and pl, when the first cell is optimized so that the transistors ns and ps exhibit one and the same threshold voltage level. It is then noted that, for the same doping levels of the wells and ground planes of the first and second cells, the discrepancy in threshold voltage between the transistors ns and nl is 70 mV whereas the discrepancy in threshold voltage between the transistors ps and pl is 140 mV. The optimization of the leakage current is therefore not the same for the transistors nl and pl and the threshold voltage levels for these transistors are not identical.

The diagram of FIG. 4 illustrates the leakage currents and the conduction currents for the transistors ns, ps, nl and pl, when the second cell is optimized so that the transistors nl and pl exhibit one and the same threshold voltage level. It is then noted that, for the same doping levels of the wells and ground planes of the first and second cells, the discrepancy in threshold voltage between the transistors ns and nl is 70 mV whereas the discrepancy in threshold voltage between the transistors ps and pl is 140 mV. The optimization of the leakage current is therefore not the same for the transistors ns and ps and the threshold voltage levels for these transistors are not identical.

SUMMARY

A need therefore exists for an integrated circuit comprising MOS transistors of FDSOI technology exhibiting different threshold voltage levels, in which the threshold voltage distortions of an nMOS and of a pMOS of one and the same level are removed or substantially reduced.

The invention thus pertains to an integrated circuit such as defined in the appended claims.

Other characteristics and advantages of the invention will emerge clearly from the description given thereof hereinafter, by way of wholly nonlimiting indication, with reference to the appended drawings.

DETAILED DESCRIPTION

Figure 1:
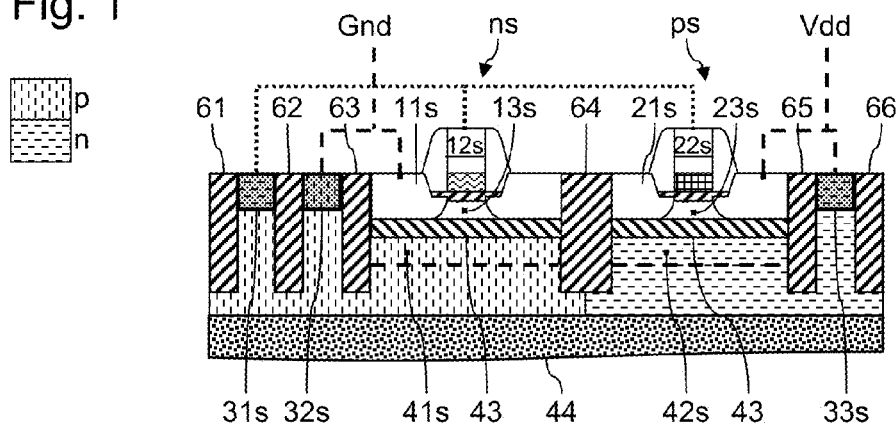
FIG. 1 is a schematic transverse sectional view of a cell with standard threshold voltage according to an example of the prior art.
Figure 2:
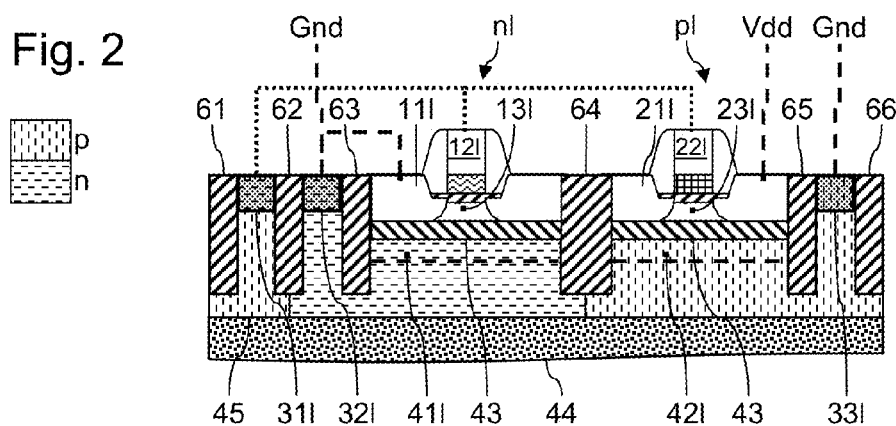
FIG. 2 is a schematic transverse sectional view of a cell with low threshold voltage according to an example of the prior art.
Figure 3:
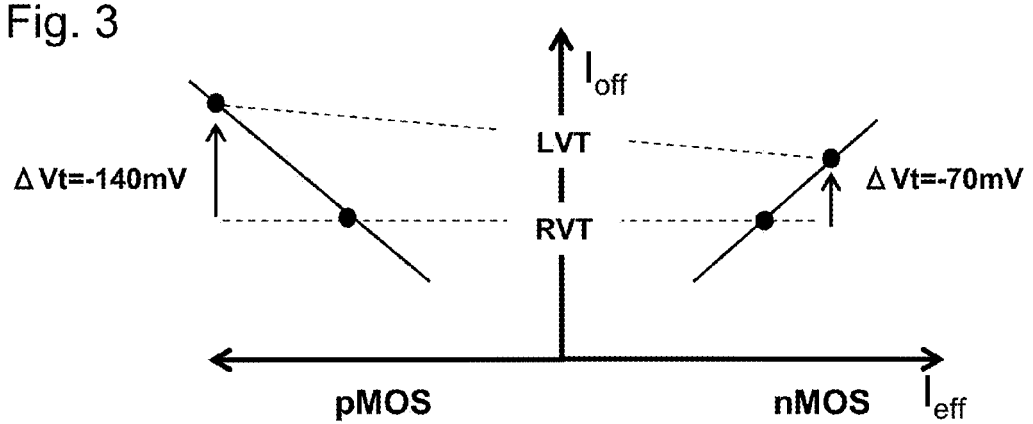
FIGS. 3 and 4 are diagrams illustrating the conduction and leakage currents in two typical cases for the cells of the prior art.
Figure 4:
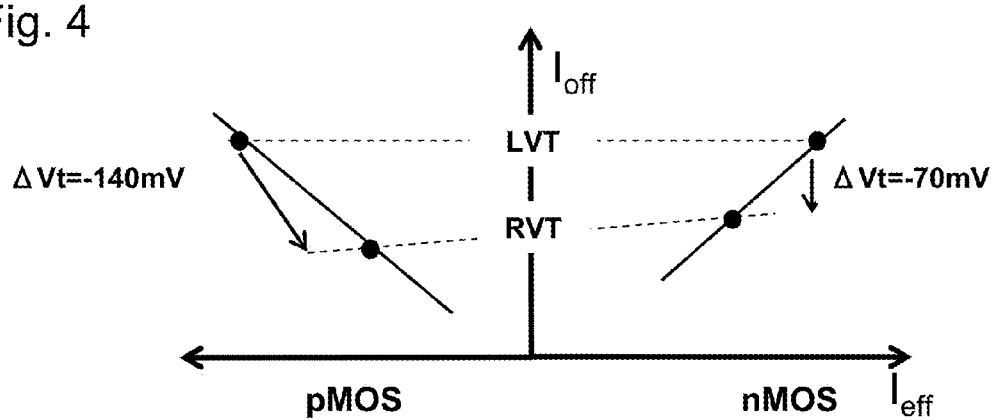
Figure 5:
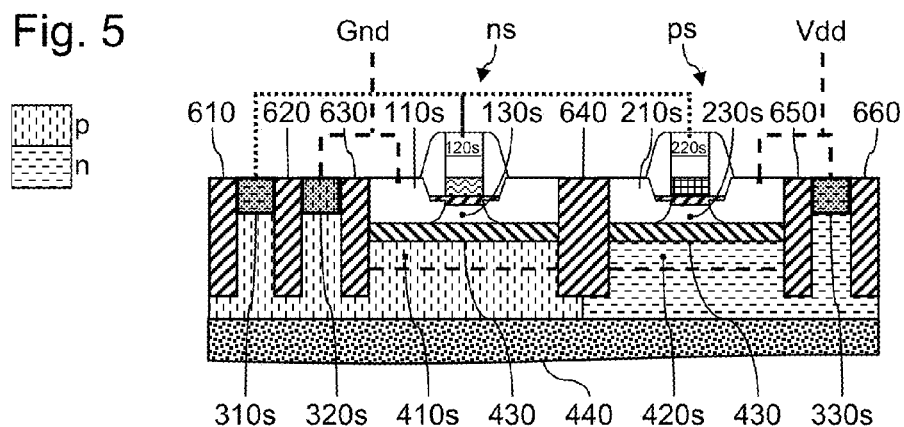
FIG. 5 is a schematic transverse sectional view of a cell with standard threshold voltage according to an embodiment of the invention.

FIG. 5 represents a transverse sectional view of a first cell of RVT type of an integrated circuit according to an embodiment of the invention. The first cell comprises a semi-conducting substrate 440. This substrate 440 here exhibits a doping of type p, with a concentration of dopants of less than or equal to $10^{16}$ cm$^{-3}$, and, preferably, less than 5*$10^{15}$cm$^{-3}$.

The first cell comprises:

a buried layer 430 of an electrically insulating material. By electrically insulating material what is meant is a material whose electrical resistivity, measured at a temperature of 20° C., is greater than or equal to $10^5$ Ω·m or $10^6$ Ω·m. For example, this layer 430 is made of silicon oxide (SiO$_2$);

field-effect MOS transistors, namely an nMOS transistor ns and a pMOS transistor ps. The source, the drain and the channel of the transistor ns are formed in a semi-conducting layer 110*s* disposed on the buried layer 430. The source, the drain and the channel of the transistor ps are formed in a semi-conducting layer 210*s* disposed on the buried layer 430;

semi-conducting ground planes 410*s* and 420*s* are situated under the layer 430 and placed plumb, respectively, with the transistors ns and ps. The ground planes 410*s* and 420*s* respectively exhibit dopings of type p and n;

semi-conducting wells extend depth-wise in continuity respectively with the ground planes 410*s* and 420*s*. In this description, the thickness and the depth are defined with respect to a direction perpendicular to a plane in which the substrate 440 extends. The wells form a separation between the ground planes 410*s* and 420*s* and the substrate 440.

The first cell will typically be disposed in a row of cells, in which the nMOSs of various cells are mutually aligned and in which the pMOSs of various cells are mutually aligned.

The ground plane 410*s* and the well disposed in continuity therewith are biased to Gnd (with Gnd=0V) by way of a P+ implanted zone 320*s*. The ground plane 420*s* and the well disposed in continuity therewith are biased to Vdd (with Vdd=1V) by way of an N+ implanted zone 330s. One and the same bias can be applied to the gates of the transistors ns and ps.

The first cell is isolated at its periphery by isolation trenches 610 and 660. The implanted zones 310s and 320s are separated by an isolation trench 620. The implanted zone 320s is separated from the transistor ns by way of an isolation trench 630. The transistor ns is separated from the transistor ps by an isolation trench 640. The transistor ps is separated from the implanted zone 330s by way of an isolation trench 650. The wells extend more deeply than the isolation trenches, 630 and 650, in particular so as to allow a biasing of the ground planes by a lateral contact.

In a manner known per se, the combination:
of a fine buried insulator layer 430;
of a given bias on the ground planes 410s and 420s,
of a given type of doping of these ground planes makes it possible to influence the threshold voltage of the transistors ns and ps. The ground planes actually make it possible to control the electrostatic properties of the channel of the transistors.

Figure 6:
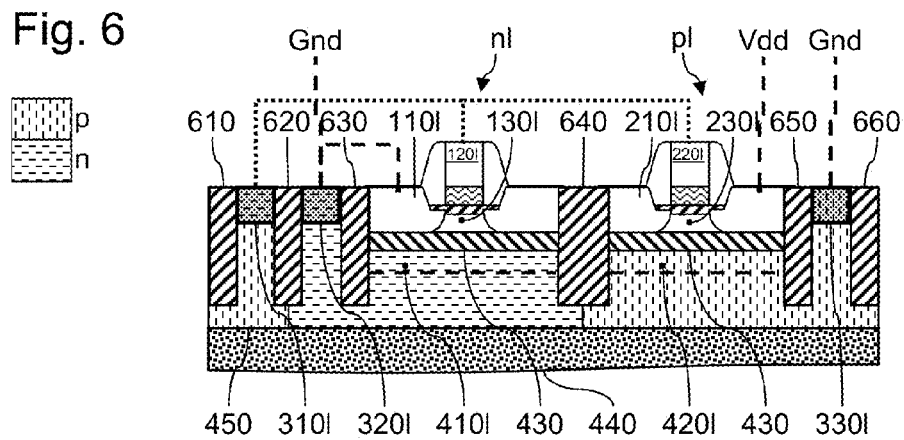
FIG. 6 is a schematic transverse sectional view of a cell with low threshold voltage according to an embodiment of the invention.

FIG. 6 represents a transverse sectional view of a second cell of LVT type of the integrated circuit. The second cell comprises:
a buried layer 430 of an electrically insulating material;
field-effect MOS transistors, namely an nMOS transistor nl and a pMOS transistor pl. The source, the drain and the channel of the transistor nl are formed in a semi-conducting layer 110l disposed on the buried layer 430. The source, the drain and the channel of the transistor pl are formed in a semi-conducting layer 210l disposed on the buried layer 430; semi-conducting ground planes 410l and 420l are situated under the layer 430 and placed plumb, respectively, with the transistors nl and pl. The ground planes 410l and 420l respectively exhibit dopings of type n and p. The dopings of the ground planes 410l and 420l are therefore opposite to the dopings of the ground planes 410s and 420s respectively; semi-conducting wells extend depth-wise in continuity respectively with the ground planes 410l and 420l. The wells form a separation between the ground planes 410l and 420l and the substrate 440.

The second cell will typically be disposed in a row of cells, in which the nMOSs of various cells are mutually aligned and in which the pMOSs of various cells are mutually aligned.

The ground plane 410l and the well disposed in continuity therewith are biased to Gnd by way of an N+ implanted zone 320l. The ground plane 420l and the well disposed in continuity therewith are biased to Gnd by way of a P+ implanted zone 330l. One and the same bias can be applied to the gates of the transistors nl and pl.

The second cell is isolated at its periphery by isolation trenches 610 and 660. The implanted zones 310l and 320l are separated by an isolation trench 620. The implanted zone 320l is separated from the transistor nl by way of an isolation trench 630. The transistor nl is separated from the transistor pl by an isolation trench 640. The transistor pl is separated from the implanted zone 330l by way of an isolation trench 650. The wells extend more deeply than the isolation trenches, 630 and 650, in particular so as to allow a biasing of the ground planes by a lateral contact.

In a manner known per se, the combination:
of a fine buried insulator layer 430;
of a given bias on the ground planes 410l and 420l,
of a given type of doping of these ground planes makes it possible to influence the threshold voltage of the transistors nl and pl. The ground planes actually make it possible to control the electrostatic properties of the channel of the transistors.

First and second cells can be co-integrated in the same rows or in distinct rows sharing one and the same buried insulator layer. The transistors ns, ps, nl and pl are produced according to FDSOI technology. The transistor ns comprises a semi-conducting layer 110s, surmounted by a gate stack 120s. This layer 110s forms a channel 130s between a source and a drain of the transistor ns. The transistor nl comprises a semi-conducting layer 110l, surmounted by a gate stack 120l. This layer 110l forms a channel 130l between a source and a drain of the transistor nl. The transistor ps comprises a semi-conducting layer 210s, surmounted by a gate stack 220s. This layer 210s forms a channel 230s between a source and a drain of the transistor ps. The transistor pl comprises a semi-conducting layer 210l, surmounted by a gate stack 220l. This layer 210l forms a channel 230l between a source and a drain of the transistor pl. In a manner known in FDSOI technology, the channels 130s, 130l, 230s and 230l are in a depleted state and exhibit a very low doping level, typically less than or equal to $10^{15}$ cm$^{-3}$.

The doping level of the ground planes 410l, 420l, 410s and 420s is advantageously at least equal to $10^{18}$ cm$^{-3}$, for example between $10^{18}$ cm$^{-3}$ and $10^{20}$ cm$^{-3}$. This doping level is for example formed on a ground plane thickness of at least 10 nm under the buried insulator layer 430. The doping level of the wells is for example at least equal to $10^{16}$, and for example between $10^{16}$ and $10^{18}$ cm$^{-3}$.

The difference between the work functions of the gate metals of the gate stacks 220s and 220l is between 55 and 85 meV, preferably between 60 and 80 meV, advantageously between 65 and 75 meV and preferably equal to 70 meV. The channels 130s, 130l, 230s and 230l contain a negligible quantity of germanium. The gate stacks 120s, 120l and 220l comprise one and the same gate metal whose work function is between 4.555 and 4.575 eV, and preferably equal to 4.565 eV. The gate stack 220s comprises a gate metal whose work function is between 4.625 and 4.645 eV, and preferably equal to 4.635 eV. The following materials can for example be used for the gate metals of the transistors: titanium nitride (TiN), tantalum nitride (TaN) with or without the presence of aluminium in the composition (TiAlN or TaAlN), or else a layer of aluminium interposed between two layers of TiN: TiN/Al/TiN.

In combination with other parameters detailed subsequently, the discrepancy between the threshold voltages ns and nl is substantially 70 mV. Likewise, the discrepancy between the threshold voltages ps and pl is substantially 70 mV. The threshold voltages are therefore balanced for the nMOS and pMOS transistors of one and the same threshold voltage level (LVT or RVT) of the integrated circuit. Such a discrepancy of the order of 70 mV between the transistors of LVT type and the RVT transistors turns out to be desirable. Likewise, for one and the same threshold voltage level, the nMOS and pMOS transistors exhibit homogeneous leakage currents and conduction currents. These results are obtained without making it necessary to bias the ground planes with different voltage levels from the levels of the supply voltages of the transistors ns, ps, nl and pl. Such a result is furthermore obtained by using a gate material for the transistor pl already used for the transistors ns and nl, not therefore inducing any further complication of the process for fabricating the integrated circuit. Moreover, the difference between the work functions of the transistors pl and ps is relatively reduced, thereby rendering the method of fabrication easier to implement.

For a 28 nm technological node:
the layer 430 is of UTBOX type and exhibits a thickness of between 20 and 30 nm, and advantageously of 25 nm;

the layers 110s, 110l, 210s and 20l exhibit a thickness of between 6 and 8 nm, and advantageously of 7 nm;
the gate oxide in the gate stacks 120s, 120l, 220s and 220l exhibits an electrical thickness of between 1.3 and 1.7 nm, and advantageously of 1.5 nm.

Simulations for this technological node with the parameters mentioned above have made it possible to determine threshold voltages of a level of 0.48V for the transistors ns and ps, and threshold voltages of a level of 0.41V for the transistors nl and pl.

For a 14 nm technological node:
the layer 430 is of UTBOX type and exhibits a thickness of between 15 and 25 nm, and advantageously of 20 nm;
the layers 110s, 110l, 210s and 20l exhibit a thickness of between 5 and 7 nm, and advantageously of 6 nm;
the gate oxide in the gate stacks 120s, 120l, 220s and 220l exhibits an electrical thickness of between 1.1 and 1.5 nm, and advantageously of 1.3 nm.

For a 10 nm technological node:
the layer 430 is of UTBOX type and exhibits a thickness of between 10 and 20 nm, and advantageously of 15 nm;
the layers 110s, 110l, 210s and 20l exhibit a thickness of between 4 and 6 nm, and advantageously of 5 nm;
the gate oxide in the gate stacks 120s, 120l, 220s and 220l exhibits an electrical thickness of between 1 and 1.2 nm, and advantageously of 1.1 nm.

In the example detailed above, the channel of the transistors comprises a negligible quantity of germanium and the middle of the forbidden band of the silicon (termed the midgap value) corresponds to the mean value between the work function value of the gate metal of the gate stack 220s and the work function value of the gate metal of the gate stack 220l.

To have greater flexibility in the value of the respective work functions of the gate metals of the stacks 220s and 220l, it is possible to include germanium in the channel of the pMOS transistors ps and pl.

The concentration of germanium atoms in the channels of the transistors ps and pl is for example between 0 and 40%. Designating by Xge the percentage of germanium in these channels, simulations have made it possible to deduce parameters for the work function of the metals of the gate stacks such as to preserve equilibrium of the threshold voltages for the nMOS and pMOS transistors of one and the same threshold voltage level (LVT or RVT) of the integrated circuit. Preserving a difference between the work functions of the gate metals of the gate stacks 220s and 220l of between 60 and 80 meV (or of between 65 and 75 meV), the work function Wf1 of the gate metal of the gate stacks 120s, 120l and 220l must comply with the following condition:

$$Wfmg-0.04-0.005*Xge < Wf1 < Wfmg-0.03-0.005*Xge$$

Wfmg being the work function corresponding to the middle of the forbidden band of the silicon (about 4.6 eV).

For example, with Xge=12, a work function Wfmg of 4.505 eV will for example be taken.

For a 28 nm technological node, preserving the parameters mentioned above (thickness of the layer 430, thickness of the layers 110s, 110l, 210s and 20l, thickness of the gate oxide in the gate stacks 120s, 120l, 220s and 220l), simulations have made it possible to determine threshold voltages of a level of 0.42V for the transistors ns and ps, and threshold voltages of a level of 0.35V for the transistors nl and pl (discrepancy between the threshold voltages maintained at 70 mV).

The invention claimed is:
1. An integrated circuit, comprising:
a semi-conducting substrate;
a first cell, comprising:
  a first FDSOI field effect transistor of nMOS type whose source and drain are disposed in contact with a silicon semi-conducting layer and whose channel is suitable for being formed in the silicon semi-conducting layer and a second FDSOI field-effect transistor, of pMOS type whose source and drain are disposed in contact with one of a silicon and silicon-germanium semi-conducting layer and whose channel is suitable for being formed in one of the silicon and silicon-germanium semi-conducting layer; the first FDSOI field effect transistor including a first gate stack and the second FDSOI field effect transistor including a second gate stack, each gate stack including a gate metal;
  a first type p doped semi-conducting ground plane, biased to a low level and placed under the first FDSOI field effect transistor and a second type n doped semi-conducting ground plane biased to a high level and placed under the second FDSOI field effect transistor;
a second cell, comprising:
  a third FDSOI field-effect transistor of nMOS type whose source and drain are disposed in contact with a silicon semi-conducting layer and whose channel is suitable for being formed in the silicon semi-conducting layer and fourth FDSOI field-effect transistor of pMOS type whose source and drain are disposed in contact with one of a silicon and silicon-germanium semi-conducting layer and whose channel is suitable for being formed in one of the silicon and silicon-germanium semi-conducting layer; the third FDSOI field-effect transistor including a third gate stack and the fourth FDSOI field-effect transistor including a fourth gate stack, each gate stack including a gate metal;
  a third type n doped semi-conducting ground plane biased to a low level and placed under the third FDSOI field-effect transistor and a fourth type p doped semi-conducting ground plane biased to a low level and placed under the fourth FDSOI field-effect transistors;
a buried oxide layer extending between the first, second, third and fourth transistors, and between the first, second, third and fourth ground planes;
wherein the gate metals of the first, third and fourth gate stacks exhibit a first work function, the gate metal of the second gate stack exhibits a second work function which is greater than the first work function; the difference between the first and second work functions being between 55 and 85 meV and the first work function, Wf1, satisfying the relation Wfmg−0.04−0.005*Xge<Wf1<Wfmg−0.03−0.005*Xge, with Xge being the percentage of germanium in the channel of the transistors of the pMOS type and Wfmg being the work function corresponding to the middle of a forbidden band of the silicon;
further including one of the following:
for a 28 nm technological node:
  a buried oxide layer exhibiting a thickness of between 20 and 30 nm;
  the semi-conducting layer in which the sources, drains and channels of the said transistors are formed exhibiting a thickness of between 6 and 8 nm;
  a gate oxide in said gate stacks exhibiting an electrical thickness of between 1.3 and 1.7 nm; and for a 14 nm technological node:
- a buried oxide layer exhibiting a thickness of between 15 and 25 nm;
- the semi-conducting layer in which the sources, drains and channels of the said transistors are formed exhibiting a thickness of between 5 and 7 nm;
- a gate oxide in the said gate stacks exhibiting a thickness of between 1.1 and 1.5 nm; and for a 10 nm technological node:
- a buried oxide layer exhibiting a thickness of between 10 and 20 nm;
- the semi-conducting layer in which the sources, drains and channels of the said transistors are formed exhibiting a thickness of between 4 and 6 nm;
- a gate oxide in the said gate stacks exhibiting a thickness of between 1 and 1.2 nm.

2. The circuit according to claim 1, in which the percentage of germanium in the channel of the pMOS transistors is zero.

3. The circuit according to claim 1, further comprising a bias circuit configured to generate a top bias level of between 0.8 and 1.2V and a bottom bias level of between −0.2 and 0.2V.

4. The circuit according to claim 3, in which said ground planes are biased by the bias circuit by way of contacts made laterally and by way of wells forming a semi-conducting link between the said contacts and the said ground planes.

5. The circuit according to claim 1, in which the difference between the first and second work functions is between 65 and 75 meV.

6. The circuit according to claim 1, in which Xge is less than 40.

* * * * *